(12) United States Patent
Daems et al.

(10) Patent No.: US 8,268,533 B2
(45) Date of Patent: Sep. 18, 2012

(54) FLEXOGRAPHIC PRINTING FORME PRECURSOR FOR LASER ENGRAVING

(75) Inventors: Eddie Daems, Herentals (BE); Luc Leenders, Herentals (BE)

(73) Assignee: AGFA Graphics NV, Mortsel (BE)

( * ) Notice: Subject to any disclaimer, the term of this patent is extended or adjusted under 35 U.S.C. 154(b) by 498 days.

(21) Appl. No.: 12/446,601

(22) PCT Filed: Dec. 18, 2007

(86) PCT No.: PCT/EP2007/064121
§ 371 (c)(1),
(2), (4) Date: Apr. 22, 2009

(87) PCT Pub. No.: WO2008/074796
PCT Pub. Date: Jun. 26, 2008

(65) Prior Publication Data
US 2010/0009285 A1    Jan. 14, 2010

Related U.S. Application Data

(60) Provisional application No. 60/885,508, filed on Jan. 18, 2007.

(30) Foreign Application Priority Data

Dec. 20, 2006 (EP) .................... 06126593

(51) Int. Cl.
*G03F 7/027* (2006.01)
*G03F 7/075* (2006.01)
*G03F 7/26* (2006.01)
*B41N 1/08* (2006.01)

(52) U.S. Cl. ............... 430/306; 430/281.1; 430/300; 101/453; 101/463.1

(58) Field of Classification Search .............. 430/300, 430/302, 306, 281.1; 101/450.1, 453, 463.1
See application file for complete search history.

(56) References Cited

U.S. PATENT DOCUMENTS

| 3,758,306 | A |  | 9/1973 | Roos |  |
|---|---|---|---|---|---|
| 4,130,084 | A |  | 12/1978 | Hoelen |  |
| 4,376,210 | A | * | 3/1983 | Chang | 556/450 |
| 6,344,303 | B1 | * | 2/2002 | Takahashi | 430/253 |
| 6,609,459 | B1 | * | 8/2003 | Figov | 101/150 |
| 6,616,974 | B1 | * | 9/2003 | Lorig et al. | 427/271 |
| 2002/0123003 | A1 |  | 9/2002 | Kannurpatti et al. |  |
| 2004/0157162 | A1 | * | 8/2004 | Yokota et al. | 430/306 |
| 2008/0063979 | A1 | * | 3/2008 | Tomita et al. | 430/287.1 |

FOREIGN PATENT DOCUMENTS

| DE | 2 021 444 |  | 2/1971 |
| EP | 1 004 362 A1 |  | 5/2000 |
| EP | 1 637 322 A2 |  | 3/2006 |
| EP | 1 710 093 A1 |  | 10/2006 |
| GB | 2 297 717 A |  | 8/1996 |
| WO | 2005/113240 A1 |  | 12/2005 |
| WO | WO 2006/030537 | * | 3/2006 |

OTHER PUBLICATIONS

Official Communication issued in International Patent Application No. PCT/EP2007/064121, mailed on May 19, 2008.

* cited by examiner

*Primary Examiner* — Anca Eoff
(74) *Attorney, Agent, or Firm* — Keating & Bennett, LLP

(57) ABSTRACT

A method of making a flexographic printing form precursor for laser engraving including the steps of
(i) providing at least one layer of a curable composition on a substrate;
(ii) curing the at least one layer; wherein the curable composition defining an outermost layer includes
at least 0.5% by weight relative to the total weight of the composition of an organo-silicon compound including at least one polymerizable group; and
a urethane (meth)acrylate oligomer having three or less polymerizable groups.

13 Claims, 5 Drawing Sheets

COMP-01

INV-01

INV-02

COMP-07

COMP-13

INV-03

INV-04

INV-05

INV-06

COMP-14

INV-10

FLEXOGRAPHIC PRINTING FORME PRECURSOR FOR LASER ENGRAVING

CROSS-REFERENCE TO RELATED APPLICATIONS

This application is a 371 National Stage Application of PCT/EP2007/064121, filed Dec. 18, 2007. This application claims the benefit of U.S. Provisional Application No. 60/885,508, filed Jan. 18, 2007, which is incorporated by reference herein in its entirety. In addition, this application claims the benefit of European Application No. 06126593.0, filed Dec. 20, 2006, which is also incorporated by reference herein in its entirety.

BACKGROUND OF THE INVENTION

1. Field of the Invention

The present invention relates to a laser engravable flexographic printing form precursor for laser engraving. The present invention also relates to a method of forming a flexographic printing form by laser engraving.

2. Description of the Related Art

Flexography is today one of the most important processes for printing and commonly used for high-volume runs. Flexography is employed for printing on a variety of substrates such as paper, paperboard stock, corrugated board, films, foils and laminates. Packaging foils and grocery bags are prominent examples. Coarse surfaces and stretch films can be economically printed only by means of flexography, which indeed makes it very appropriate for packaging material printing. It uses a rubber printing plate or a flexible photopolymer plate that carries the printing image in relief. The ink delivery system for flexography is achieved via an "anilox" engraved ink transfer roll.

Analogue flexographic printing forms are prepared from printing form precursors including a photosensitive layer on a support or substrate. The photosensitive layer includes ethylenically unsaturated monomers or oligomers, a photo-initiator and an elastomeric binder. The support preferably is a polymeric foil such as PET or a thin metallic plate. Image-wise crosslinking of the photosensitive layer by exposure to ultraviolet and/or visible radiation provides a negative working printing form precursor which after development with a suitable developer (aqueous, solvent or heat development) leaves a printing relief, which can be used for flexographic printing. Imaging of the photosensitive layer of the printing form precursor with ultraviolet and/or visible radiation is typically carried out through a mask, which has clear and opaque regions. Crosslinking takes place in the regions of the photosensitive layer under the clear regions of the mask but does not occur in the regions of the photosensitive layer under the opaque regions of the mask. The mask is usually a photographic negative of the desired printed image. Flexographic printing form making according to the above described process has the disadvantage that the production of a mask is time consuming and that the dimensional stability of these masks with changing environmental temperatures or humidities is unsatisfactory for high quality printing and color registration. Moreover, the use of separate masks in flexographic printing form production means additional consumables and chemistry, with a negative impact on economy and ecology aspects of the production process, which are far more a concern than the additional time required for making the masks. As a matter of fact, in most cases plate exposure and plate development may turn out to be more time consuming than mask making.

Digital imaging using laser recording of printing form precursors, which eliminates the making of a separate film mask, is becoming increasingly important in the printing industry. The flexographic printing form precursor is made laser-sensitive by providing e.g., a thin, for UV and visual radiation opaque, IR-sensitive layer on top of the photopolymerizable layer of the flexographic printing form precursor. Such a flexographic printing form, also referred to as flexographic printing plate precursor, is sometimes called a "digital" or "direct-to plate" flexographic printing plate precursor. An example of such a "direct-to-plate" flexo plate precursor is disclosed in EP-A 1 170 121. The thickness of the IR-ablative layer(s) is usually just a few µm. The IR-ablative layer is inscribed image-wise using an IR laser, i.e., the parts in which the laser beam is incident on it are ablated, i.e., removed. The actual printing relief is produced in the conventional manner: exposure with actinic light (UV, visible) through the mask, the mask being image-wise opaque to the crosslinking inducing light, resulting in an image-wise crosslinking of the photopolymerizable layer, i.e., relief forming layer. Development with an organic solvent, water or heat removes the photosensitive material from the unexposed parts of the relief forming layer and the residues of the IR-ablative layer. Development may be performed using different developing steps or a single developing step. Since this method still requires a developing step, the improvement in efficiency for producing flexo printing forms is limited.

In the direct laser engraving technique for the production of flexographic printing forms, a relief suitable for printing is engraved directly into a layer suitable for this purpose. By the action of laser radiation, layer components or their degradation products are removed in the form of hot gases, vapors, fumes, droplets or small particles and nonprinting indentations are thus produced. Engraving of rubber printing cylinders by means of lasers has been known since the late 60s of the last century. However, this technique has acquired broader commercial interest only in recent years with the advent of improved laser systems. The improvements in the laser systems include better focusing ability of the laser beam, higher power, multiple laser beam or laser source combinations and computer-controlled beam guidance. Direct laser engraving has several advantages over the conventional production of flexographic printing plates. A number of time-consuming process steps, such as the creation of a photographic negative mask or development and drying of the printing plate, can be dispensed with. Furthermore, the sidewall shape of the individual relief elements can be individually designed in the laser engraving technique.

A problem associated with direct laser engraving is the formation of debris. The debris is presumed to be decomposition products of the resin of the precursor formed by the action of the laser. Gaseous or particulate ablated material is, at least partially, removed by an exhaust fan. However, liquefied ablated material may be very difficult to be removed. The generation of such debris not only necessitates a time consuming treatment to remove the debris, but may result in coarse and irregular edged relief shapes. Moreover, when a large amount of liquid debris is generated during laser engraving, the debris may stain the optical parts of the laser engraving apparatus, necessitating a time consuming cleaning procedure or an expensive replacement of the laser optics.

EP-A 1 424 210 discloses a photosensitive resin composition for a laser engravable precursor including (1) 100 parts by weight of a resin which is a plastomer at 20° C. wherein the resin has a number average Molecular Weight (Mw) of from 1,000 to 100,000 and has at least 0.7 of an average number of polymerizable groups per molecule, (2) 5 to 200 parts by weight, relative to 100 parts by weight of the resin (1) of an organic compound having a Mw of less than 1,000 and having at least one polymerizable group per molecule and (3) 1 to 100 parts by weight, relative to 100 parts by weight of the resin (1) of an inorganic porous material. The inorganic porous material, preferably porous silica products, is used to absorb the liquid debris formed upon laser engraving of the cured resin composition.

US 2005/0227165 discloses a photosensitive resin composition for a laser engravable precursor including (1) 100 parts by weight of a resin which is in a solid state at 20° C. wherein the resin has a number average Molecular Weight (Mw) of from 5,000 to 300,000, (2) 5 to 200 parts by weight, relative to 100 parts by weight of the resin (1) of an organic compound having a Mw of less than 5,000 and having at least one polymerizable group per molecule and (3) 1 to 100 parts by weight, relative to 100 parts by weight of the resin (1) of an inorganic porous material having an average pore diameter of from 1 nm to 1,000 nm, a pore volume of from 0.1 ml/g to 10 ml/g and a number average particle diameter of not more than 10 μm. The inorganic porous material, preferably porous silica products, is used to absorb the liquid debris formed upon laser engraving of the cured resin composition.

EP-A 1 710 093 discloses a photosensitive resin composition for a laser engravable precursor including a (1) a resin having polymerizable groups and a number average Molecular Weight (Mw) in the range of 1,000 to 200,000, (2) an organic compound having a polymerizable group and a Mw of less than 1,000 and (3) an organo-silicon compound having at least one Si—O bond. The organo-silicon compound does not have unsaturated polymerizable groups and is present in an amount of 0.1 to 10% by weight relative to the total photosensitive resin composition.

EP-A 539 227 discloses an aqueous developable composition suitable for preparing flexographic printing forms, including (1) a polymerizable material and (b) a hydrophobic compound containing an element selected from the group consisting of fluorine, chlorine and silicon, the hydrophobic compound being capable of copolymerizing with the polymerizable composition. The presence of the hydrophic compound reduces "plugging", i.e., build up of foreign material such as ink between relief parts of the plate during printing. The flexographic printing form of EP-A 539 227 is prepared by aqueous development after image-wise exposure of the precursor through a negative mask.

JP 2005-254696 A discloses a flexographic printing form including a cylindrical substrate and a curable composition provided thereon wherein the photocurable composition contains an organo-silicon or organo-fluor compound. The printing form has a Shore D hardness of from 30 to 100 making the printing form suitable for intaglio printing. A flexographic printing form having a Shore D hardness of more than 30 (equivalent with a Shore A hardness of more than 80) is outside the scope of the present invention.

SUMMARY OF THE INVENTION

In order to overcome the problems described above, preferred embodiments of the present invention provide a flexographic printing form precursor for laser engraving wherein, upon laser engraving of the precursor, the debris formation is suppressed.

Another preferred embodiment of the present invention provides a method for preparing the precursor.

Another preferred embodiment of the present invention provides a method of making a flexographic printing form by direct laser engraving wherein the debris formation is suppressed.

According to a preferred embodiment of the present invention, a flexographic printing form precursor for laser engraving includes an outermost layer formed by a curable composition including at least 0.5% by weight relative to the total weight of the composition of an organo-silicon compound including at least one polymerizable group and an urethane (meth)acrylate oligomer having three or less polymerizable groups.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
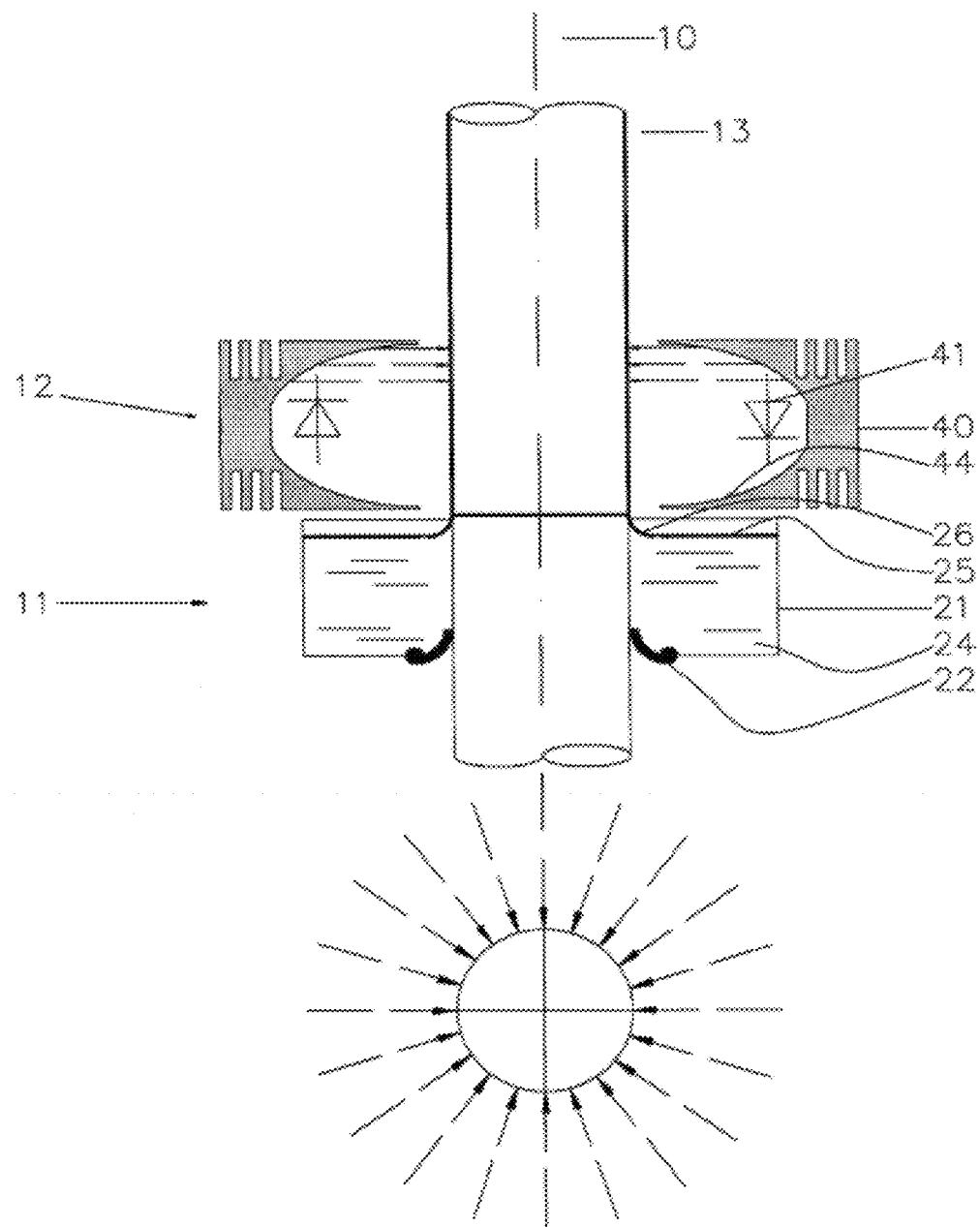
FIG. 1 shows a preferred embodiment of the "vertical" coating device disclosed in EP-A 06 120 823, incorporating an annular irradiation stage.

The flexographic printing form precursor according to a preferred embodiment of the present invention is prepared by (i) providing at least one layer of a curable composition on a substrate; (ii) curing the at least one layer; characterized in that the curable composition forming an outermost layer includes, at least 0.5% by weight relative to the total weight of the composition of an organo-silicon compound including at least one polymerizable group; and an urethane (meth)acrylate oligomer having three or less polymerizable groups.

Printing Form Precursor Including One Layer on a Substrate

In one preferred embodiment of the present invention the flexographic printing form precursor includes one layer of a curable composition provided on a substrate.

Organo-Silicon Compounds

An organo-silicon compound is an organic compound, i.e., carbon and hydrogen atom containing compound, including one or more silicon (Si) atoms.

The organo-silicon compound according to a preferred embodiment of the present invention includes at least one polymerizable group, preferably a radically polymerizable group. The radically polymerizable group is preferably a (meth)acrylate group.

According to a preferred embodiment, the organo-silicon compound is an organo-silane compound including at least one polymerizable group. Preferably the polymerizable group is a (meth)acrylate group. A preferred organosilane compound is represented by Formula I:

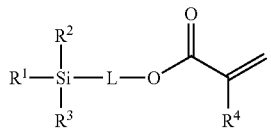

Formula I

Wherein
L represents an optional divalent linking group;
$R^1$, $R^2$, $R^3$ independently represent an optionally substituted alkyl, aryl or alkoxy group;
$R^4$ represents a hydrogen or an optionally substituted alkyl or aryl group.

Preferably $R^1$, $R^2$ and $R^3$ independently represent a methyl, an ethyl, a propyl, a butyl, a methoxy, an ethoxy, a propoxy or a butoxy group.

Preferably R1 is methyl or hydrogen.

The optional divalent linking group L of Formula I is preferably a methylene, ethylene, proplene or butylene group.

Commercially available compounds according to Formula I are e.g., GENIOSIL XL33, GENIOSIL XL36, GENIOSIL GF31 all available from WACKER CHEMIE.

According to a particularly preferred embodiment, the organosilicon compound, including at least one polymerizable group, is a silicon (meth)acrylate. Curable silicon (meth) acrylates are known in the art as slip and wetting improving additives in coatings on paper or plastic substrates. Other typical applications for UV curable silicon (meth)acrylates are release coatings for self adhesive labels.

Commercially available silicon (meth)acrylates are polysiloxanes, e.g., polydimethylsiloxanes, wherein (meth)acrylate groups are incorporated. The (meth)acrylate groups may be incorporated as side groups on the polysiloxane backbone or may be end-capped on the polysiloxane chain or both.

Commercially available silicon (meth)acrylates are for example EBECRYL 350 and EBECRYL 1360 from CYTEC; CN9800, CN990 and CNUVS500 from SARTOMER; PC900UV/EB, DV910UV, DV911UV, PC970UV/EB and DV980UV/EB from RHODIA; TEGO RC 902, TEGO RC 715, TEGO RC 711, TEGO RC 719, TEGO RC 1002, TEGO RC 1009, TEGO RC 1771, TEGORAD 2100, TEGORAD 2200N, TEGORAD 2300, TEGORAD 2500, TEGORAD 2600 and TEGORAD 2700 all from DEGUSSA GOLDSCHMIDT.

In a preferred embodiment of the present invention the organo-silicon compound includes at least two polymerizable groups, preferably at least two (meth)acrylate groups.

In an even more preferred embodiment, the organo-silicon compound includes at least four polymerizable groups, preferably at least four (meth)acrylate groups.

In a most preferred embodiment, the organo-silicon compound includes six polymerizable groups, preferably six (meth)acrylate groups.

The amount of the organo-silicon compound in the curable resin composition is at least 0.5% by weight, more preferably at least 1% by weight, more preferably at least 2.5% by weight, most preferably at least 5.0% by weight relative to the total weight of the curable composition. The amount of the organo-silicon compound is preferably less than 20% by weight, more preferably less than 10% by weight relative to the total weight of the curable composition.

Initiators

The curable resin composition according to a preferred embodiment of the present invention may include one or more initiator(s). The initiator typically initiates the polymerization reaction. The initiator may be a thermal initiator, but is preferably a photo-initiator.

Thermal initiator(s) suitable for use in the curable resin composition include tert-amyl peroxybenzoate, 4,4-azobis (4-cyanovaleric acid), 1,1'-azobis(cyclohexanecarbonitrile), 2,2'-azobisisobutyronitrile (AIBN), benzoyl peroxide, 2,2-bis(tert-butylperoxy)butane, 1,1-bis(tert-butylperoxy)cyclohexane, 1,1-Bis(tert-butylperoxy)cyclohexane, 2,5-bis(tert-butylperoxy)-2,5-dimethylhexane, 2,5-bis(tert-butylperoxy)-2,5-dimethyl-3-hexyne, bis(1-(tert-butylperoxy)-1-methylethyl)benzene, 1,1-bis(tert-butylperoxy)-3,3,5-trimethylcyclohexane, tert-butyl hydroperoxide, tert-butyl peracetate, tert-butyl peroxide, tert-butyl peroxy benzoate, tert-butylperoxy isopropyl carbonate, cumene hydro peroxide, cyclohexanone peroxide, dicumyl peroxide, lauroyl peroxide, 2,4-pentanedione peroxide, peracetic acid and potassium persulfate.

A photo-initiator produces initiating species, preferably free radicals, upon absorption of actinic radiation. A photo-initiator system may also be used. In the photo-initiator system, a photo-initiator becomes activated upon absorption of actinic radiation and forms free radicals by hydrogen or electron abstraction from a second compound. The second compound, usually called the co-initiator, becomes then the initiating free radical. Free radicals are high-energy species inducing polymerization of monomers or oligomers. When polyfunctional monomers and oligomers are present in the curable resin composition, the free radicals can also induce cross-linking.

Curing may be realized by more than one type of radiation with different wavelength. In such cases it may be preferred to use more than one type of photo-initiator together.

A combination of different types of initiators, for example, a photo-initiator and a thermal initiator may also be used.

Suitable photo-initiators are disclosed in e.g., J. V. Crivello et al. in "Photoinitiators for Free Radical, Cationic & Anionic Photopolymerisation $2^{nd}$ edition", Volume III of the Wiley/ SITA Series In Surface Coatings Technology, edited by G. Bradley and published in 1998 by John Wiley and Sons Ltd London, pages 276 to 294.

Specific examples of photo-initiators may include, but are not limited to, the following compounds or combinations thereof: quinones, benzophenone and substituted benzophenones, hydroxy alkyl phenyl acetophenones, dialkoxy acetophenones, α-halogeno-acetophenones, aryl ketones such as 1-hydroxycyclohexyl phenyl ketone, 2-hydroxy-2-methyl-1-phenyl propan-1-one, 2-benzyl-2-dimethylamino-(4-morpholinophenyl)butan-1-one, thioxanthones such as isopropylthioxanthone, benzil dimethylketal, bis(2,6-dimethyl benzoyl)-2,4,4-trimethylpentylphosphine oxide, trimethylbenzoyl phosphine oxide derivatives such as 2,4,6 trimethylbenzoyl diphenylphosphine oxide, methyl thio phenyl morpholine ketones such as 2-methyl-1-[4-(methylthio)phenyl]-2-morpholinopropan-1-one, morpholino phenyl amino ketones, 2,2-dimethoxy-1,2-diphenylethan-1-one, 5,7-di-iodo-3-butoxy-6-fluorone, diphenyliodonium fluoride and triphenylsulfonium hexafluophosphate, benzoin ethers, peroxides, biimidazoles, aminoketones, benzoyl oxime esters, camphorquinones, ketocoumarins and Michler's ketone.

Suitable commercial photo-initiators include Irgacure 127, Irgacure 184, Irgacure 500, Irgacure 907, Irgacure 369, Irgacure 1700, Irgacure 651, Irgacure 819, Irgacure 1000, Irgacure 1300, Irgacure 1800, Irgacure 1870, Darocur 1173, Darocur 2959, Darocur 4265 and Darocur ITX available from CIBA SPECIALTY CHEMICALS, Lucerin TPO available from BASF AG, Esacure KK, Esacure KT046, Esacure KT055, Esacure KIP150, Esacure KT37 and Esacure EDB available from LAMBERTI, H-Nu 470 and H-Nu 470X available from SPECTRA GROUP Ltd., Genocure EHA and Genocure EPD from RAHN.

Since curing is preferably realized with UV-radiation, the preferred photo-initiators absorb UV radiation.

To improve in depth curing, it may be advantageous to use an initiator system that decreases in UV absorbance as polymerization proceeds, as disclosed in US 2002/0123003 paragraph [0021].

Particular preferred photo-initiators are Irgacure 651 and Irgacure 127.

Suitable cationic photo-initiators include compounds, which form aprotic acids or Bronsted acids upon exposure sufficient to initiate polymerization. The photo-initiator used may be a single compound, a mixture of two or more active compounds, or a combination of two or more different compounds, i.e., co-initiators. Non-limiting examples of suitable cationic photo-initiators are aryldiazonium salts, diaryliodonium salts, triarylsulphonium salts, triarylselenonium salts and the like.

Sensitizing agents may also be used in combination with the initiators described above. In general, sensitizing agents absorb radiation at a wavelength different then the photo-initiator and are capable of transferring the absorbed energy to that initiator, resulting in the formation of e.g., free radicals.

The amount of initiator in the curable resin composition of a preferred embodiment of the present invention is preferably from 1 to 10% by weight, more preferably from 2 to 8% by weight, relative to the total weight of the curable resin composition.

Curable Compounds

The curable resin composition includes an urethane (meth) acrylate oligomer having three or less polymerizable groups. It has been found that the presence of such urethane (meth) acrylate oligomers, preferably in an amount of 50% by weight or more, relative to the total composition, provides a cured resin composition suitable for preparing direct laser engravable flexographic printing form precursors.

Commercially available urethane (meth)acrylates are, e.g., CN9170, CN910A70, CN966H90, CN962, CN965, CN9290 and CN981 from SARTOMER; BR-3741B, BR-403, BR-7432, BR-7432G, BR-3042, BR-3071 from BOMAR SPECIALTIES CO.; NK Oligo U-15HA from SHIN-NAKAMURA CHEMICAL CO. Ltd.; Actilane 200, Actilane SP061, Actilane 276, Actilane SP063 from AKZO-NOBEL; Ebecryl 8462, Ebecryl 270, Ebecryl 8200, Ebecryl Ebecryl CL-1039, Ebecryl 285, Ebecryl 4858, Ebecryl 210, Ebecryl 220, Ebecryl 1259 and IRR160 from CYTEC; Genomer 1122 and Genomer 4215 from RAHN A.G. and VERBATIM HR50 an urethane acrylate containing liquid photopolymer from CHEMENCE The composition may include one or more further curable compounds. These curable compounds may include one or more polymerizable groups, preferably radically polymerizable groups.

Any polymerizable mono- or oligofunctional monomer or oligomer commonly known in the art may be employed. Preferred monofunctional monomers are described in EP-A 1 637 322 paragraph [0054] to [0057]. Preferred oligofunctional monomers or oligomers are described in EP-A 1 637 322 paragraphs [0059] to [0064].

The selection of curable compounds determines the properties of the cured resin composition, e.g., laser engravability, ink transfer, flexibility, resilience, hardness.

To optimize the viscosity of the curable resin composition, one or more monomers and/or oligomers are used as diluents. Preferred monomers and/or oligomers acting as diluents are miscible with the above described urethane (meth)acrylate oligomers. Particularly preferred monomers and/or oligomers acting as diluents do not adversely affect the properties of the cured resin composition.

The monofunctional monomer(s) or oligomer(s) used as diluents are preferably low viscosity acrylate monomer(s).

Particularly preferred monomers and/or oligomers acting as diluents in the curable resin composition of the present invention are: SR344, a polyethyleneglycol (400) diacrylate; SR604, a polypropylene monoacrylate; SR9003, a propoxylated neopentyl glycol diacrylate; SR610, a polyethyleneglycol (600) diacrylate; SR531, a cyclic trimethylolpropane formal acrylate; SR340, a 2-phenoxyethyl methacrylate; 2-phenoxyethylacrylate; tetrahydrofurfuryl acrylate; all from SARTOMER; caprolactone acrylate and Genomer 1122, a monofunctional urethane acrylate from RAHN; Bisomer PEA6, a polyethyleneglycol monoacrylate from COGNIS; Ebecryl 1039, a very low viscous urethane monoacrylate from CYTEC and CN137, a low viscosity aromatic acrylate oligomer from CRAYNOR.

Inhibitors

In order to prevent premature thermal polymerization, the curable resin composition may contain a polymerization inhibitor. Suitable polymerization inhibitors include phenol type antioxidants, hindered amine light stabilizers, phosphor type antioxidants, hydroquinone monomethyl ether, hydroquinone, t-butyl-catechol or pyrogallol.

Suitable commercial inhibitors are, for example, Sumilizer GA-80, Sumilizer GM and Sumilizer GS produced by Sumitomo Chemical Co. Ltd.; Genorad 16, Genorad 18 and Genorad 20 from Rahn AG; Irgastab UV10 and Irgastab UV22, Tinuvin 460 and CGS20 from Ciba Specialty Chemicals; Floorstab UV range (UV-1, UV-2, UV-5 and UV-8) from Kromachem Ltd, Additol S range (S100, S110, S120 and S130) from Cytec Surface Specialties.

Since excessive addition of these polymerization inhibitors will lower the curing the amount is preferably lower than 2% by weight relative to the total weight of the curable resin composition.

Elastomers

To further optimize the properties of the flexographic printing form precursor the curable composition may further include one or more elastomeric compounds. Suitable elastomeric compounds include copolymers of butadiene and styrene, copolymers of isoprene and styrene, styrene-diene-styrene triblock copolymers, polybutadiene, polyisoprene, nitrile elastomers, polyisobutylene and other butyl elastomers, polyalkyleneoxides, polyphosphazenes, elastomeric polyurethanes and polyesters, elastomeric polymers and copolymers of (meth)acrylates, elastomeric polymers and copolymers of olefins, elastomeric copolymers of vinylacetate and its partially hydrogenated derivatives.

The type and amount of monomers and/or oligomers and optionally the elastomeric compounds are selected to realize optimal properties of the printing form precursor such as laser engravability, flexibility, resilience, hardness, adhesion to the substrate and ink transfer during printing.

The hardness of a flexographic printing form precursor is typically expressed as Shore A Hardness. The Shore A hardness of a flexographic printing form according to a preferred embodiment of the present invention is typically between 30 and 75.

The optimal viscosity of the curable composition depends on the technique used to provide the curable composition on a substrate.

Plasticizers

Plasticizers are typically used to improve the plasticity or to reduce the hardness of the flexographic printing form precursor. Plasticizers are liquid or solid, generally inert organic substances of low vapor pressure.

Suitable plasticizers include modified and unmodified natural oils and resins, alkyl, alkenyl, arylalkyl or arylalkenyl esters of acids, such as alkanoic acids, arylcarboxylic acids or phosphoric acid; synthetic oligomers or resins such as oligostyrene, oligomeric styrene-butadiene copolymers, oligomeric α-methylstyrene-p-methylstyrene copolymers, liquid oligobutadienes, or liquid oligomeric acrylonitrile-butadiene copolymers; and also polyterpenes, polyacrylates, polyesters or polyurethanes, polyethylene, ethylene-propylene-diene rubbers, α-methyloligo (ethylene oxide), aliphatic hydrocarbon oils, e.g., naphthenic and paraffinic oils; liquid polydienes and liquid polyisoprene.

Examples of particularly suitable plasticizers are paraffinic mineral oils; esters of dicarboxylic acids, such as dioctyl adipate or dioctyl terephthalate; naphthenic plasticizers or polybutadienes having a molar weight of between 500 and 5,000 g/mol.

More particularly preferred plasticizers are Hordaflex LC50 available from HOECHST, Santicizer 278 available from MONSANTO, TMPME available from PERSTORP AB, and Plasthall 4141 available from C. P. Hall Co.

It is also possible to use a mixture of different plasticizers.

Preferred plasticizers are liquids having molecular weights of less than 5,000, but can have molecular weights up to 30,000.

IR Absorbers

To improve the laser engraving sensitivity of the flexographic printing form precursor, the curable composition may further include an additive, organic or inorganic, which absorbs the radiation of the laser engraving laser. Preferably the additive is an infrared (IR) absorbing compound since the laser used for engraving is typically a $CO_2$ laser.

Colorants

Colorants, dyes and/or pigments, may also be added to the curable composition to enable a visual inspection of the laser engraved image on the flexographic printing form.

Printing Form Precursor Including More than One Layer

In another preferred embodiment of the present invention the flexographic printing form precursor includes more than one layer of a curable composition provided on a substrate, with the proviso that the curable composition forming the outermost layer of the precursor includes at least 0.5% by weight relative to the total weight of the composition of the organo-silicon compound described above.

The more than one curable compositions forming the more than one layers according to this preferred embodiment of the present invention may include the ingredients described above, i.e., organo-silicon compound, initiator, curable compound, elastomer, plasticiser, inhibitor, colorant, IR absorbing compound, surfactant. The curable compositions not forming an outermost layer preferably do not include the organo-silicon compound described above. The more than one layers of the precursor formed by providing the more than one curable compositions on a substrate may be characterized by different properties, i.e., hardness, by selecting different curable compounds, elastomers or plasticisers for the different curable compositions.

In another preferred embodiment of the present invention more than one curable composition are provided on a substrate with the proviso that the curable composition forming the outermost layer consists essentially of the organo-silicon compound described above and optionally an initiator. The thickness of the outermost layer consisting essentially of the organo-silicon compound and optionally an initiator is preferably less than 0.5 mm, more preferably less than 0.1 mm, most preferably less than 0.050 mm.

It has surprisingly been found that a flexographic printing form precursor including an outermost layer, the outermost layer consisting essentially of the organo-silicon compound and optionally an initiator and having a thickness substantially smaller than the laser engraving depth, the depth typically a few hundred microns, results in less debris formation upon laser engraving of the precursor.

Preferably, if more than one curable composition are provided on a substrate, at least one curable composition includes at least 50% by weight relative to the total weight of the composition of an urethane (meth)acrylate oligomer having three or less polymerizable groups.

Substrates

The curable compositions may be provided onto a substrate by any conventional method such as coating, extrusion or cast molding. The curable compositions may be provided on the substrate while heating. A particularly preferred method for making flexographic printing forms for direct laser engraving is disclosed in the unpublished EP-A 06 120 823 (filed 18-09-2006).

The substrate may be any flexible material conventionally used to prepare flexographic printing form precursors. Examples of suitable support materials are disclosed in EP-A 1 710 093 paragraph [0051]. A preferred support is a polyester film.

The substrate may be in a sheet form or in a cylindrical form, such as a sleeve. The sleeve may be formed from a single layer or multiple layers of flexible and/or rigid material. Seamless sleeves are particularly preferred.

The substrate, a sheet or sleeve, ensures dimensional stability to the flexographic printing form precursor. The outer surface of the substrate may be treated chemically (alkali/acid treatment) or physically (e.g., corona treatment, sand blast treatment), or be provided with a subbing layer of an adhesive material or primer, to facilitate the adherence of the curable layer(s) to the support.

The total thickness of the one or more layers of a curable composition provided on the substrate is preferably from 0.4 to 7.0 mm.

Curing

After providing the layer(s) of the curable composition(s) on a substrate, the layer(s) are cured by irradiation or heat.

Heat may be used to cure (i.e., polymerize) the composition(s) if composition(s) layer(s) includes a thermal initiator, as described above.

Irradiation may be electron beam irradiation or actinic irradiation, preferably actinic irradiation. Curing with electron beam irradiation does not necessitate the presence of an initiator in the curable composition(s). The suitability of a particular actinic radiation source is governed by the photosensitivity of the initiator used in preparing the flexographic printing form precursor. The preferred photosensitivity of most common flexographic printing form precursors is in the UV and deep UV region of the spectrum.

Examples of suitable radiation sources include carbon arcs, mercury-vapor arcs, fluorescent lamps, electron flash units, electron beam units, lasers, LEDs and photographic flood lamps. Preferred sources of UV radiation are the mercury vapor lamps.

UV radiation is generally classified as UV-A, UV-B and UV-C as follows:

UV-A: 400 nm to 320 nm
UV-B: 320 nm to 290 nm
UV-C: 290 nm to 100 nm

It may be advantageous to use two radiation sources to perform the curing. For example, the first UV source may be selected to be an UV-A or UV-C radiation source while the second UV source may be selected to be an UV-A or UV-C radiation source. The second curing step is often referred to as a post curing step. It has been observed that performing a post curing step with a UV-C radiation source after a first curing step with UV-A radiation results is advantageous to obtain a non-tacky surface of the printing element.

When more than one layer of curable compositions is provided on a substrate, curing may be performed after providing all of the layers on the substrate or curing may be performed after each layer has been provided on the substrate.

The curing time will vary depending on the intensity and spectral energy distribution of the radiation, the distance between the light source and the printing element, the composition and thickness of the curable composition(s) of the printing form precursor.

A removable coversheet may be present during curing, to minimize the inhibition of the polymerization by oxygen. The coversheet is removed after curing and prior to the laser engraving step. Another method to minimize the inhibition by oxygen is performing the curing under inert $N_2$ or $CO_2$ atmosphere.

Grinding and Polishing

To obtain a high quality flexographic printing form precursor, especially a seamless sleeve, it is often necessary to grind and polish the cured printing element prior to the laser engraving step.

Coating Method for Preparing Flexographic Printing Sleeves

A particularly preferred method for making flexographic printing sleeves for direct laser engraving, without the need for grinding and polishing, is disclosed in the unpublished EP-A 06 120 823 (filed 18-09-2006). EP-A 06 120 823 discloses a "vertical" coating device that supports a wide range of sleeve types and sizes, and is capable of coating a single or a multitude of "uniform" layer(s) of direct laser engravable material. The uniformity of the coated layer(s) is provided through at least partial curing of the layer(s) immediately after coating.

A preferred embodiment of the "vertical" coating device disclosed in EP-A 06 120 823 is now described with reference to FIG. 1. The coating collar 21 in FIG. 1 includes an annular squeegee 22 providing a slidable seal between the bottom of the coating collar 21 and the sleeve core 13, in order to prevent a curable composition 24, also referred to as coating liquid, contained in the coating collar 21 to leak from the coating collar 21. The coating collar 21 is open at the top. The liquid surface 25 of the coating liquid 24 contained in the coating collar 21 forms an annular meniscus 26 with the peripheral surface of the sleeve 13. The coating collar 21 may be supported by a coating carriage that is connected to a lifting and lowering mechanism incorporated in a vertical support column. These features have been omitted in FIG. 2. The lifting and lowering mechanism can move the entire coating stage 11, i.e., the assembly of the coating carriage with the coating collar, up and down along a vertical axis. When a sleeve 13 is mounted, the lifting and lowering mechanism is capable of moving the annular coating stage 11 along the peripheral surface of the sleeve 13, providing a coating meniscus 26 at the top and a sealing contact at the bottom of the coating collar 21. The coating axis 10 refers to the vertical axis through the center of the coating collar 21 and coinciding with the axis of the sleeve 13 when mounted on the coating device. The coating collar 21 moves up and down, centered round the coating axis 10.

On top of the annular coating stage 11, an annular irradiation stage 12 is mounted. The purpose of the irradiation stage 12 is to set the coated layer, just applied by the annular coating collar 21, and prevent the coating liquid from running down. Running down of the coated layer decreases the layer thickness at upper locations and increases the layer thickness at lower locations along the sleeve 13, and decreases the topographic uniformity of the layer and therefore the quality of the applied coating. It is therefore an advantage to "freeze" the coated layer right after application onto the sleeve 13. The term "freeze" does not necessarily imply a full setting of the coated layer; a partial setting of the layer to prevent run-down of the coating liquid from the sleeve 13 is sufficient to provide a uniform layer of coating material.

Figure 2:
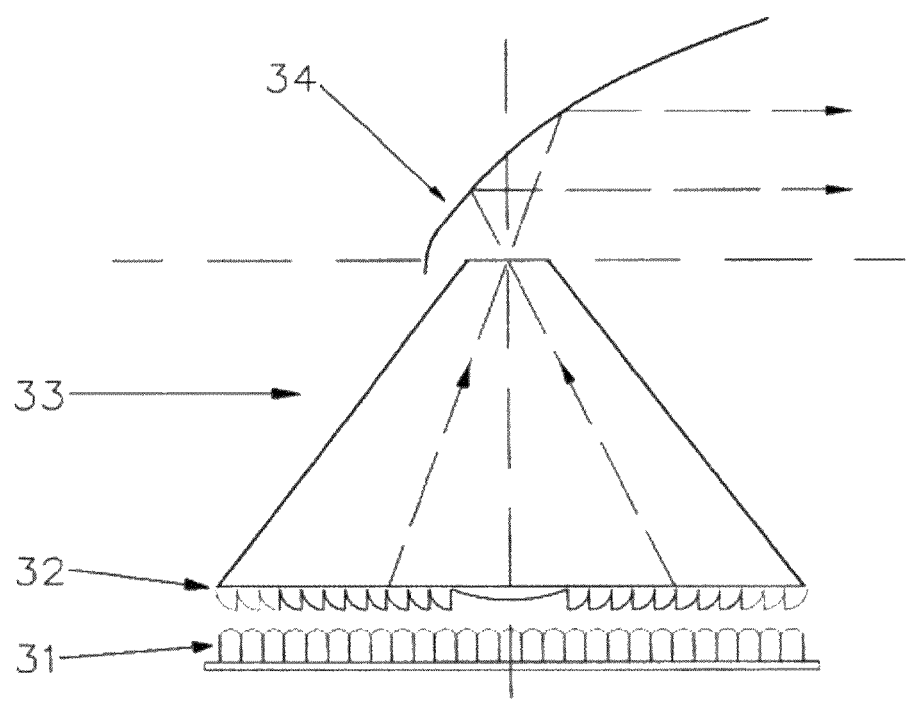
FIG. 2 shows a cross-sectional view of a preferred embodiment of an annular irradiation stage.
Figure 3:
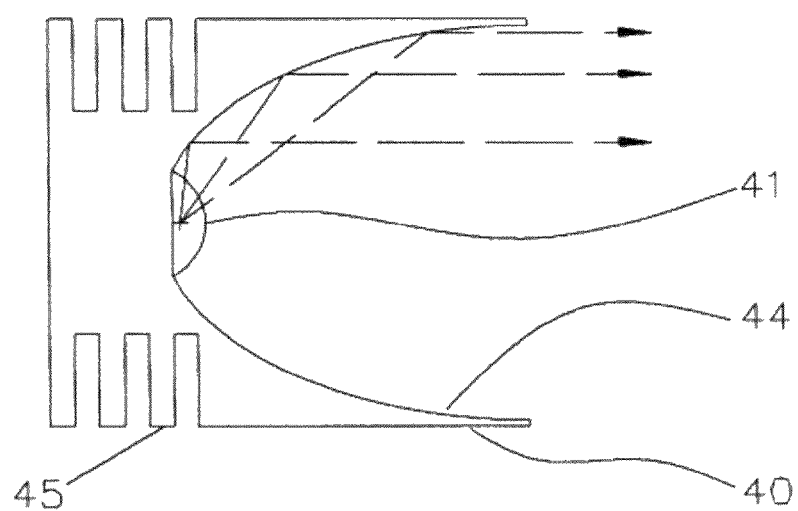
FIG. 3 shows a cross-sectional view of another preferred embodiment of an annular irradiation stage.

In a preferred embodiment, the irradiation stage 12 may be 360° all round and based on the use of UV LEDs and concentrating or collimating optics. UV LED's have several advantages compared to UV arc lamps, such as their compactness, acceptable wavelength and beam stability, good dose uniformity and a large linear dose regulation range. A disadvantage of the UV LED's is their relative low power output. UV LEDs however are relatively small and can be grouped together in such a way that their combined power is sufficient to cover the required UV curing range for different types of coating liquids, different thicknesses of coating layer, different sleeve diameters (i.e., distance from UV LED to peripheral surface of the sleeve), etc. A cross-sectional view of a first preferred embodiment of an annular irradiation stage is shown in FIG. 2. The irradiation stage is construed around an array of LEDs 31, a Fresnel lens 32 with reflector 33 and collimating mirror 34. The role of the optics is twofold: firstly Fresnel lens 32 with reflector 33 concentrates the light from the array of LEDs 31 into the focal point of the collimating mirror 34, and secondly the collimating mirror 34 collimates the light from the array of LEDs 31 into parallel horizontal beams for irradiating the coated layer on the sleeve. Revolving this optical setup 360° around the coating axis provides radiation from an annular radiation source, i.e., an annular LED array, which is substantially collimated in the horizontal direction and substantially focused onto the coating axis 10, as illustrated by the arrows in the lower part of FIG. 1. A cross-sectional view of a second preferred embodiment of an annular irradiation stage is illustrated in FIG. 3 and shows a LED 41 positioned at the focal point of a parabolic reflecting cavity 44 of collimator base 40. A heat sink 45 for removing heat from the LED 41 is integrated in the collimator base 40. The small size of the LED 41 allows it to be positioned in the focal point of the parabolic reflecting cavity 44 without creating substantial voids in the collimated output beam. Revolving this optical setup 360° round the coating axis results in an annular radiation source and annular collimating optics for providing annular radiation as explained above.

The radiation energy contained in the collimated beam can be easily modulated, by adjusting the radiation intensity, so as to accommodate for the variation in distance or diameter of different sleeve cores, as well as for variations in formulation of the coating liquid.

The result is a radiation beam with large beam uniformity, high beam stability, wide range of beam intensity adjustment (LEDs can be dimmed to a few % of their maximal output power or can be time modulated), and precise UV curing control through ease of calibration. The advantages are: (i) no extra mechanical adjustments required when changing sleeve cores or sleeve core diameters—short sleeve change over time, (ii) irradiation power adaptable—no power loss, and (iii) uniform beam properties for accurate and uniform curing—combined quality and speed aspects.

The annular shape of the UV LED array 41 and associated collimating optics 44 of the irradiation stage 12 allows a uniform annular irradiation of the coated layer. Furthermore, its compactness and low weight allow the annular irradiation stage 12 to be fixedly mounted on the annular coating stage 11. In operation, the annular irradiation stage 12 then moves along with the annular coating stage 11 and only one drive mechanism for moving the assembly up and down the sleeve core 13 is required.

Certain applications may require the use of a multitude of irradiation stages 12, mounted in cascade, for providing radiation with different wavelengths, at different distances from the coating stage 11, providing different radiation power, etc. The multitude of irradiation stages may be mounted on top of each other as one assembly, which itself may be mounted onto the coating stage 11. Mechanically linking the stages together is not mandatory. It is however preferred that the stages be movable up and down the sleeve core in a synchronized way.

Notwithstanding the movement of the coating stage 11 and possible disturbances of the liquid surface 25 in the coating collar 21, experiments show surprisingly that the coated layer, applied with a coating device as described above, is of very good homogeneity and surface evenness.

In the various preferred embodiments described so far the irradiation source, e.g., an individual LED or an annular LED array, was linked to a corresponding collimating optics, e.g., a paraboloidal reflector respectively an annular collimating optics, and was considered one assembly. In an alternative preferred embodiment the optics may be omitted in which case the LED radiation source directly irradiates the peripheral surface of the coated sleeve. Rotation of the irradiation source may provide additional integration and averaging of the radiation energy. In another alternative preferred embodiment a non-rotating annular collimating optics may be combined with a rotating radiation source. In this configuration, the radiation source orbits between the peripheral surface of the sleeve core and the annular collimating optics.

From EP-A 06 120 823 is known that the viscosity of the curable composition, i.e., coating liquid, is an important parameter in controlling the thickness of the applied layer. It is therefore preferable to shield the coating liquid in the coating collar from any sources that may have a direct or indirect impact on the viscosity of the coating liquid. In radiation curable systems, the viscosity of a liquid is made controllable via exposure to radiation, i.e., the change the viscosity of a coated layer in order to freeze, set or cure the coated liquid is controlled via exposure to radiation. The coating device according to a preferred embodiment of the present invention therefore preferably includes a radiation lock positioned between the radiation stage and the coating stage, and movable therewith, for shutting off direct and indirect, e.g., scattered, radiation of the radiation source from the coating liquid contained in the coating collar. The radiation lock is preferably annular shaped and may for example be realized by providing a cover to the coating collar reservoir. A more advanced radiation lock would be an adjustable iris diaphragm as used in optics, the diaphragm opening being adjusted to be slightly larger than the diameter of the sleeve to be coated. The annular radiation lock may be mechanically integrated in the coating stage, in the irradiation stage or as a separate unit in between both stages.

In applications using free radical UV curable liquids, it is known that the curing, in some cases, may be retarded or even non-existent due to the presence of oxygen in the cure zone. In this case, an inerted atmosphere may be used to enhance the cure capabilities. When related to UV curing, the term 'inerted' simply means the elimination in ideal situations or, more appropriately, the minimizing of the amount of inhibiting oxygen at the surface of the coating within the UV cure zone. In a vertical coating device according to a preferred embodiment of the present invention, the cure zone refers to the area surrounding the coated layer on the peripheral surface of the sleeve core that is exposed to the radiation from the irradiation stage. An inert environment may be created by (i) adding a gas such as nitrogen, argon or carbon dioxide to the atmosphere in the cure zone and especially close to or at the surface of the coated layer, and (ii) minimizing the possibility of ingress of air, a.o. through a drag effect resulting from the relative movement between the coated layer and the irradiation stage, in that zone.

Adding an inert gas, such as nitrogen, argon or carbon dioxide, to the atmosphere in the cure zone may be accomplished by use of an annular manifold, connected with flexible tubing to a source of inert gas housed in the vertical support column of the coating device. Annular clearance seals at both ends of the cure zone, i.e., at the upper and lower end of the irradiation stage, with a small clearance to the peripheral surface of the coated sleeve may be used to prevent the inert gas from flowing out of the cure zone. These seals preferably have an adjustable inner diameter to fit with a small clearance to the various sleeve diameters. Iris diaphragms may be suitable seals for this purpose. A controlled flow of inert gas within the cure zone may be realized when using two manifolds, i.e., an inlet and outlet manifold.

The ingress of air in the cure zone is likely to occur at the lower end of the cure zone when the coating stage moves downward during the coating process, that is, from between the coating stage and the irradiation stage. Counteracting the air intake may be realized by means of an annular blow knife at the lower entrance of the curing zone, i.e., between the irradiation stage and the coating stage. The annular blow knife, moving along between the coating stage and the irradiation stage, may be connected with flexible tubing to a source of inert gas housed in the vertical support column of the coating device.

Adding a "closed" inert environment to the irradiation stage, has been described for oxygen inhibition in free radical UV curing systems. Depending on the coating formulation and the way the coated liquid layer is surface-cured, other preferred embodiments of an inert environment may be thought of.

Instead of providing and integrating a series of supplementary tools in and around the movable irradiation stage to create an inert environment in the cure zone, the entire coating device may be capped to close off the device from the ambient environment, in which case the task of creation of an inert environment within the coating device is much simpler. Alternatively, the entire coating device may be installed in an inert environment provided by the end user.

It has been mentioned in a previous section that the radiation power may be adjusted as a function of the optical distance from the irradiation source to the peripheral surface of the sleeve, such that adequate curing or "freezing" of the coated layer onto the peripheral surface of the sleeve is achieved. This improves the compatibility of the irradiation stage with different sleeve diameters. It is especially advantageous when the irradiation stage configuration is fixed and wherein the irradiation units are positioned outside a cylindrical space envelope around the coating axis occupied by the largest sleeve diameter within a range of different sleeve diameters. Alternatively, when the irradiation stage configuration is adjustable, the radial position of individual irradiation units from the coating axis, i.e., their radial coordinate in a polar coordinate system around the coating axis, and/or the spinning velocity of these units around the coating axis may be adjusted in order to keep the radiation energy received per unit area on the peripheral surface of sleeves of different sleeve diameters constant.

Regarding the operation of the coating stage with different size sleeve cores, the coating meniscus and the annular seal are important issues. The annular seal around the peripheral surface of the sleeve prevents leakage and run down of coating liquid from the coating collar. When changing sleeve diameter, either the entire coating collar (including the annular seal) may be replaced by another suited for the new sleeve diameter or only the annular seal may be replaced or adjusted to fit with the new sleeve diameter. If the annular seal is realized as an iris diaphragm of which the aperture is adjustable within a range, no replacement parts are required when changing the sleeve diameter, provided that the sleeve diameter falls within the range of the adjustable aperture. If the annular seal is removably attached to the coating collar, a seal with a different fixed internal diameter may be used. The range of annular seal internal diameters that can be used with a coating collar is determining the maximum and minimum sleeve diameter that can be coated with that coating collar.

Preferably that coating stage and the irradiation stage are designed to support the same range of sleeve diameters so that both modules can be pre-assembled as a tandem and be inserted or replaced as one assembly.

As described above, the irradiation stage or multitude of irradiation stages are mounted on top of the coating stage and move together with the coating stage as a single "coating assembly". From a mechanical point of view, this provides the advantage that only one lifting and lowering mechanism is required to operate the vertical coating device, whereas from an electrical point of view, all electrical connections to the "coating assembly" may be provided through a single cable carrier between the stationary vertical support column and the moving "coating assembly".

Obtaining a coated layer onto sleeve cores with a controlled and uniform thickness, using one of the coating devices described above, may be difficult to achieve without any feedback regarding the irradiation dose and irradiation uniformity effectively applied to the coated layer. Therefore an energy dose controlling system may be added to the "coating assembly" for measuring the effective curing rate of the applied layer and adjusting the applied energy dose, spinning velocity (if applicable) and/or coating speed in a closed loop system. A near-infrared spectrometer may for example be used to measure the degree of UV or EB curing, i.e., the curing rate, of the coated layer.

However, if the purpose of the irradiation stage is to only partially set the coated layer to prevent run-down of the coating liquid from the sleeve, the irradiation dose is less critical and monitoring of the irradiation dose in a closed loop system may not be required. A calibration of the irradiation stage combined with open loop control may be sufficient.

A full cure of the coated layer may be provided off-line using existing sleeve processing devices or may be provided in-line using an additional radiation systems as disclosed in Japanese patent application JP 54-014630. A full cure of the coated layer may also be realized by adding radiation capacity to the existing irradiation stage. The additional capacity may be provided by increasing the radiation power (e.g., additional UV LED arrays), adding different radiation sources (e.g., adding deep cure UVA wavelength radiation to the surface cure UVC radiation), specially adapted collimating optics delivering a variable irradiation intensity as a function of the vertical distance to the coating meniscus (e.g., a radiation source with a collimating optics providing a concentrated high irradiation intensity close to the coating meniscus, to achieve surface curing of the coated layer, and a vertically spread out lower irradiation intensity further away from the coating meniscus, to realize deep curing of the coated layer), or by straightforward duplicating existing irradiations stages.

The coating device according to a preferred embodiment of the present invention may be set up and prepared for coating operations without the presence of a sleeve core. Thereto, one of the flanges or mounting heads, for mounting the sleeve onto the coating device, may be used to provide a home position to the coating assembly. The flange or mounting head providing this home position has a similar or slightly smaller external diameter than the diameter of the sleeve cores intended to be used with the flange or mounting head. When the coating assembly is in its home position, the annular seal of the coating collar may be adjusted to fit with the sleeve core diameter, even prior to mounting the sleeve core in the coating device, and the coating collar may be filled with a coating liquid, without leakage. The coating stage is then ready for coating operations.

If flanges or mounting heads are used with substantially different external diameter than the diameter of the sleeve cores to be coated, the preparation of the coating assembly can not be performed without the presence of a sleeve core mounted on the coating device. A home position for the coating assembly should then be provided by the sleeve itself. This is however not a preferred situation as it requires additional care and setup of the coating collar with each change of sleeve core.

After preparing the coating assembly and mounting the sleeve core on the coating device, the lifting and lowering mechanism moves the coating assembly to a start position with the coating meniscus close to or just past an end of the sleeve core, depending on the type of flange or mounting head used. The coating process preferably starts at the upper end of the sleeve core and continues in a downward direction to the lower end of the sleeve core while the lifting and lowering mechanism moves the coating assembly downwards. As the coating assembly moves downward, the irradiation stage follows immediately after and irradiates the just coated layer to cure at least the surface of the coated layer, which prevents run down of the applied coating liquid. If a spinning irradiation stage is used, the irradiation stage not only follows the coating meniscus at a fixed distance, but in addition spins around the sleeve core to generate a uniform 360° irradiation of the coated layer. At the end of the coating process, the lifting and lowering mechanism halts the coating assembly with the coating meniscus close to or just past the lower end of the sleeve core, depending on the type of flange or mounting head used. If the flanges or mounting heads allow end-to-end coating of the sleeve core, the coating assembly will move that far downward to allow the irradiation stage to irradiate the coated layer up to the lower end of the sleeve core. The thickness of the coated layer may be controlled via the velocity of the coating assembly moving downward, the viscosity of the coating liquid or the number of successive coating operations applied (see hereinafter). After the coating process, the coating assembly is left at its position against the lower or upper flange or mounting head and the coated sleeve may be removed without special care for the coating collar.

Alternatively, a coating layer may be applied while the coating assembly moves upward, in which case the coating mechanism is a squeegee type coating mechanism, instead of the immersion type coating during a downward movement of the coating assembly as described above. Application of a coating layer during upward movement of the coating assembly, may require an irradiation stage positioned below the coating stage and moving together with the coating stage to cure at least the surface of the squeegee coated layer. Squeegee type coated layers, associated with an upward movement of the coating collar, may be thinner than immersion type coated layers, associated with a downward movement of the coating collar. Unfortunately there is no formula, analogous to Eq.1, known to the inventors to predict the thickness of the squeegee type coated layer. Each of the alternatives may therefore have advantages in specific applications.

The coating device may also operate in a multiple pass mode with intermediate "curing" of the surface of each of the applied layers. The coating may be mainly bidirectional or unidirectional as will become clear from the following.

A multiple pass operating mode may include the steps of applying a first immersion coated layer while moving a coating assembly downward and curing at least the surface of the first immersion coated layer with an upper irradiation stage positioned above and moving with the coating stage; then moving the coating assembly upward while applying a first squeegee coated layer and optionally curing at least the surface of the first squeegee coated layer with a lower irradiation stage positioned below and moving with the coating stage; afterwards applying a second immersion coated layer while moving the coating assembly downward and curing at least the surface of the second immersion coated layer with the upper irradiation stage moving with the coating stage, etc. As the annular squeegee of the coating collar is designed to prevent leakage of coating liquid from the coating collar at the sliding contact between the coating collar and the sleeve, the thickness of the layer applied via a squeegee type coating during an upward movement of the coating assembly typically is significantly less than the thickness of the layer applied by the immersion coating during the downward movement of the coating assembly. In this case, there is a main (immersion) coating action during the downward movement of the coating assembly and a fractional (squeegee) coating action during the upward movement thereof. The coating is primarily unidirectional. Intermediate curing of the fractional (squeegee) coating layer may therefore not be necessary as it will merge with the significantly thicker subsequent main (immersion) coating layer from a subsequent coating action during a downward movement of the coating assembly. The immersion coated layer is of course irradiated using the upper irradiation stage. So, a multiple pass coating device according to a preferred embodiment of the present invention not necessarily includes an upper and a lower irradiation stage to cure at least the surface of the coated layer in both coating directions; a single irradiation stage linked with a main coating direction may serve.

Multiple pass operation of the coating device as described may be used for applying uniform thick layers of coating material onto sleeve cores. It may for example be used in cases where physico-chemical parameters of the coating liquid, e.g., viscosity, or limitations of the coating device, e.g., coating velocity, would limit the thickness of a coated layer as predicted from Eq. 1 to a value below what is functionally required for the application. Especially for flexographic sleeves or printing masters, the relief-forming layer may require a thickness of several millimeters, which is hard to achieve in a single pass coating process.

Multiple pass operation of the coating device may also be used for applying a multitude of layers of different coating liquid formulations. The coating liquids may have different physicochemical properties, e.g., viscosity, or the corresponding coated layers may have different physicochemical or mechanical properties such as compressibility, hardness, wear-resistance, wettability. E.g., for the production of flexographic sleeves, it may be desirable to have a compressible base (suitable for absorbing for example the unevenness in corrugated board printing material) and a hard surface (for increased durability and suitable for longer print runs). If desired a complete physicochemical thickness profile may be created for the coated multilayer.

The flanges or mounting heads may require regular cleaning to remove coating liquid residues from end-to-end coating processes or linked with their use as home position for the coating collar. A coating liquid repelling layer on the flanges or mounting heads may facilitate this cleaning.

Only if a different size of sleeve is to be coated, different flanges or mounting heads may be installed and the annular seal of the coating collar may be changed or adjusted to match with the new sleeve diameter. An example of an adjustable annular seal is an adjustable iris diaphragm including overlapping sealing leaves wherein the diaphragm opening, i.e., the aperture, is adjustable through adjustment of the position of the leaves relative to each other, as known in photography. The higher the number of leaves in the iris diaphragm, the better the sealing property of the iris diaphragm around the peripheral surface of the sleeve.

Laser Engraving

After curing, the printing form precursor is engraved with laser radiation. Laser engraving involves the absorption of laser radiation, localized heating and removal of the heated and/or decomposed material. In a laser engraving process, the desired image is converted into digital data and a relief pattern, corresponding to the desired image, is formed on the printing element by a laser. Typically high power lasers emitting in the infrared or near-infrared region such as Nd-YAG lasers or carbon dioxide lasers are used for laser engraving. A laser which is particularly suitable for engraving flexographic printing form precursors is a carbon dioxide laser which emits at a wavelength of 10.6 µm since the carbon dioxide lasers are commercially available at reasonable cost. The carbon dioxide laser can operate in continuous wave and/or pulse mode. Typically the flexographic printing form precursor is mounted onto a rotating drum associated with the laser. As the drum is rotated and translated relative to the laser beam, the precursor is exposed to the laser beam in a spiral fashion. The laser beam, being modulated with the image data, thus forms a relief image on the printing form precursor.

Engraving is often performed under a flow of air to remove gaseous or particulate decomposition products or under vacuum as described in, e.g., EP-A 1 727 674 and EP-A 1 727 672.

After completion of the laser engraving, powdery or liquid debris generated in small amounts may be removed by an aqueous solution including a surfactant or solvent or high pressure steam.

Commercially available laser engravers are e.g., HELIOFLEX F1200, HELIOFLEX F1600 and HELIOFLEX 2100 from HELL COMPANY; AGRIOS 512X, MORPHEUS 621X, HELIOS 6010 and NEOS 5010 from STORK;

FLEXOPOSE!DIRECT 250L, FLEXOPOSE!DIRECT 301, FLEXOPOSE!DIRECT 302, FLEXOPOSE!DIRECT 602 and FLEXOPOSE!DIRECT 603 from LUESCHER; FLEX-OSTAR CTP, DUOSTAR and FLEXOSTAR MINI from LEAD LASERS.

EXAMPLES

Materials

VERBATIM HR50 a liquid photopolymer from CHEMENCE.
IRGACURE 127 a photo-initiator from CIBA-GEIGY.
IRGACURE 651 a photo-initiator from CIBA-GEIGY.
BHT=2,6-di-t-butyl-4-methylphenol, an inhibitor from ALDRICH.
BAYSILON LACKADDITIV PL, a silicon oil from BAYER AG. In the examples this compound is referred to as BAYSILON PL.
SILICONE X22167B, a silicon oil from SHIN-ETSU CHEMICAL COMPANY.
SILICON FLUID L054 a polyalkylmethylaralkylmethylsiloxane from WACKER-CHEMIE.
SILICON OIL AP200, a silicon oil from WACKER-CHEMIE.
SYLYSIA 770, an amorphous silica from QOLORTECH BV.
TEGOGLIDE 450, a polyether modified polysiloxane from GOLDSCHMIDT.
TEGOGLIDE 410, a poly(dimethylsiloxane-co(ethyleneglycol-propylenecglycol)) lubricant.
GENIOSIL XL33, a silicone acrylate from WACKER CHEMIE.
GENIOSIL GF31, a silicone acrylate from WACKER CHEMIE.
SARTOMER CN966H90, an aliphatic urethane diacrylate from SARTOMER (a 90 wt % solution in 2-(2-ethoxyethoxyl)ethyl acrylate).
EBECRYL 350, a silicone diacrylate from CYTEC.
EBECRYL 1360, a polysiloxane hexa-acrylate from CYTEC.
ACTILANE 800, a polysiloxane acrylate resin from AKZO-NOBEL.
SARTOMER SR604, a propylene glycol methacrylate from SARTOMER.
SARTOMER SR340, a phenoxy ethoxy methacrylate from SARTOMER.
AGEFLEX FM246, a lauryl methacrylate from CIBA GEIGY.

Example 1

This example illustrates the superior laser engraving properties obtained with curable compositions including organosilicon compounds containing at least one polymerizable group compared to curable compositions including organosilicon compounds without a polymerizable group or without an organo-silicon compound.

Preparation of the Curable Compositions

The curable compositions INV-01, INV-02, COMP-01 to were prepared by mixing the ingredients from Table 1 at room temperature.

TABLE 1

| Ingredients (g) | COMP-01 | INV-01 | INV-02 | COMP-02 | COMP-03 |
|---|---|---|---|---|---|
| VERBATIM HR50 | 60 | 60 | 60 | 60 | 60 |
| IRGACURE 127 | 3.0 | 3.0 | 3.0 | 3.0 | 3.0 |
| BHT | 0.04 | 0.04 | 0.04 | 0.04 | 0.04 |
| EBECRYL 1360 | — | 2.63 | 5.48 | — | — |
| BAYSILON PL | — | — | — | 0.96 | 2.63 |
| SILICONE X22167B | — | — | — | — | — |
| SILICON FLUID L054 | — | — | — | — | — |
| SILICON OIL AP200 | — | — | — | — | — |
| SYLYSIA 770 | — | — | — | — | — |
| TEGOGLIDE 450 | — | — | — | — | — |
| TEGOGLIDE 410 | — | — | — | — | — |

| Ingredients (g) | COMP-04 | COMP-05 | COMP-06 | COMP-07 | COMP-08 |
|---|---|---|---|---|---|
| VERBATIM HR50 | 60 | 60 | 60 | 60 | 60 |
| IRGACURE 127 | 3.0 | 3.0 | 3.0 | 3.0 | 3.0 |
| BHT | 0.04 | 0.04 | 0.04 | 0.04 | 0.04 |
| EBECRYL 1360 | — | — | — | — | — |
| BAYSILON PL | — | — | — | — | — |
| SILICONE X22167B | 0.96 | — | — | — | — |
| SILICON FLUID L054 | — | 0.96 | 2.63 | — | — |
| SILICON OIL AP200 | — | — | — | 0.96 | 2.63 |
| SYLYSIA 770 | — | — | — | — | — |
| TEGOGLIDE 450 | — | — | — | — | — |
| TEGOGLIDE 410 | — | — | — | — | — |

| Ingredients (g) | COMP-09 | COMP-10 | COMP-11 | COMP-12 |
|---|---|---|---|---|
| VERBATIM HR50 | 60 | 60 | 60 | 60 |
| IRGACURE 127 | 3.0 | 3.0 | 3.0 | 3.0 |
| BHT | 0.04 | 0.04 | 0.04 | 0.04 |
| EBECRYL 1360 | — | — | — | — |
| BAYSILON PL | — | — | — | — |
| SILICONE X22167B | — | — | — | — |
| SILICON FLUID L054 | — | — | — | — |
| SILICON OIL AP200 | — | — | — | — |
| SYLYSIA 770 | 1.95 | 4.02 | — | — |
| TEGOGLIDE 450 | — | — | 2.63 | — |
| TEGOGLIDE 410 | — | — | — | 2.63 |

Laser Engraving Properties

The curable compositions INV-01, INV-02 and COMP-01 to were coated at a thickness of 700 μm on a polyester support. The coated layer was then introduced in a quartz glass box filled with nitrogen.

UV-A curing was carried out in a UV-A light box equipped with 8 Philips TL 20W/10 UVA ($\lambda_{max}$=370 nm) lamps. The distance between the lamps and the sample was approximately 10 cm.

UV-C post curing was carried out with a light-box equipped with 4 Philips TUV lamps ($\lambda_{max}$=254 nm). Post curing was performed under nitrogen. The curing time was 20 minutes.

Laser engraving of the cured compositions was performed with a Synrad 57-1 $CO_2$-laser, a continuous wave laser with a nominal power of 100 W and a spot size of 0.2 mm. The pixel dwell times were between 30 and 50 μs. Different power setting were used: 85 and 100% of the maximum power.

Figure 4:
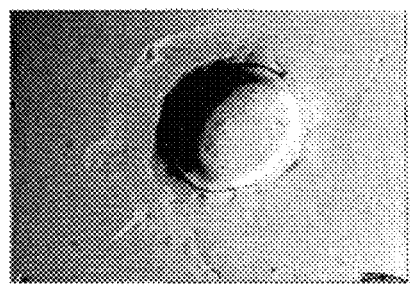
FIG. 4 shows optical microscope photographs of laser engraved holes of flexographic printing forms prepared with the curable compositions COMP-01, INV-01, INV-02 and COMP-07 of EXAMPLE 1.
Figure 4:
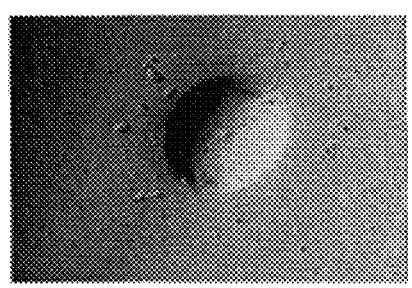
Figure 4:
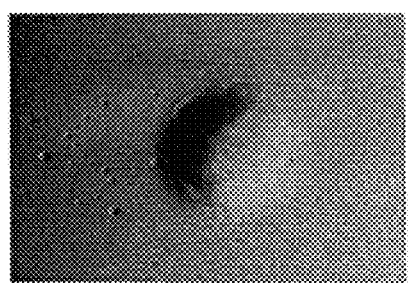
Figure 4:
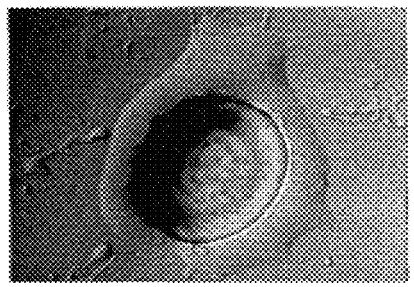

The laser engraved holes were inspected with an optical microscope (Nikon), the microscope being connected with a digital camera (JVC, TK1270). The debris level, as observed with the optical microscope, has been given a rating number from 0 to 6 (0 meaning no liquid debris, 6 meaning a high liquid debris level). The debris level is shown in Table 2. The optical microscope photographs of the samples obtained with COMP-01, INV-01, INV-02 and COMP-07 are shown in FIG. 4 as illustration of the results.

Shore A Hardness

A circular cup (diameter=5.9 cm; height=3.9 mm) was filled with the UV-curable compositions from Table 1. The excess liquid was removed with a clean cut metal blade. The cup was introduced into a quartz glass box filled with nitrogen.

The UV-A curing was performed with a UV-A light box as described above. The distance between the lamp and the sample was approximately 10 cm. The curing time was 10 minutes. Subsequently, the cured sample was released from the circular cup and the backside of the sample was cured for 5 minutes with the same exposing device.

The UV-C post curing was carried out with a light box, as described above, under nitrogen for 20 minutes.

The Shore A hardness was measured with a Shore Durometer, employing a sharp indentor point with a load of 12.5 N. The scale readings range from 0 (0.1" penetration) to 100 (zero penetration).

Flexibility

The formulations of Table 1 were coated at a thickness of 290 μm on a polyester support. The UV-A and UV-C post curing were performed as described above. The flexibility was determined by bending the samples 180° and evaluating the presence of fractures in the cured layer with a loupe.

Printing Properties

The formulations of Table 1 were coated at a thickness of 290 μm on a pre-cured and processed DuPont Cyrel HIQ flexographic plate. The coated layers were introduced into a quartz glass box, filled with nitrogen, and UV-A and UV-C cured as described above.

Printing was carried out on a laboratory flexographic printing press RK Koater provided with a type 360 anilox roller (cell volume 7.8 cm$^3$/m$^2$) and a steel doctor blade, all from RK Print-Coat Instruments Ltd., at a printing speed of 32.5 m/minute. The printing ink used was Aqua Base Plus Blue ET-51405, a water based pigment flexographic ink for self-adhesive labels, from Royal Dutch Printing Ink Printing Ink Factories Van Son. Prints were made on Raflagloss glossy coated paper from Raflatac Benelux. The print densities on paper were measured with a MacBeth RD918SB densitometer using an SPI filter Red.

The Shore A hardness, the printing densities and the debris level obtained with the cured compositions INV-01, INV-02 and COMP-01 to COMP-12 of Table 1 are shown in Table 2.

TABLE 2

|  | Print Density | Shore Hardness | Debris level |
|---|---|---|---|
| COMP-01 | 1.92 | 44 | 5 |
| INV-01 | 1.93 | 46 | 1 |
| INV-02 | 1.92 | 48 | 0 |
| COMP-02 | 1.94 | 43 | 3 |
| COMP-03 | 1.93 | 41 | 3 |
| COMP-04 | 1.94 | 39 | 3 |
| COMP-05 | 1.93 | 42 | 3 |
| COMP-06 | 1.91 | 41 | 3 |
| COMP-07 | 1.93 | 43 | 4 |
| COMP-08 | 1.92 | 42 | 4 |
| COMP-09 | 1.94 | 42 | 4 |
| COMP-10 | 1.94 | 45 | 3 |
| COMP-11 | 1.96 | 39 | 3 |
| COMP-12 | 1.94 | 40 | 3 |

The flexibility of all samples was excellent. Table 2 and FIG. 4 clearly indicate that with the inventive samples, and INV-02, less debris is formed compared to the comparative samples COMP-01 to COMP-12. The Shore A Hardness and the printing densities are comparable for all samples. This clearly illustrates that with the inventive compositions, including an organo-silicon compound with at least one polymerizable group, less debris is formed upon laser engraving without adversely affecting the Shore A hardness, the flexibility and the printing properties. The comparative examples having an organo-silicon compound without a polymerizable group (COMP-02 to COMP-12) do not, or only slightly, result in less debris formation compared to the comparative example without an organo-silicon compound (COMP-01).

Example 2

This example illustrates the superior laser engraving properties obtained with curable compositions including an organo-silicon compound containing at least one polymerizable group compared to curable compositions without an organo-silicon compound. This example also illustrates that a higher number of polymerizable groups of the organo-silicon compound used in the curable compositions further improves the laser engraving properties, i.e., debris formation.

Preparation of the Curable Compositions

The curable compositions INV-03 to INV-06 and COMP-13 were prepared by mixing the ingredients from Table 3 at room temperature.

TABLE 3

| Ingredients (g) | COMP-13 | INV-03 | INV-04 | INV-05 | INV-06 |
|---|---|---|---|---|---|
| Sartomer CN966H90 | 24.9 | 24.9 | 24.9 | 24.9 | 24.9 |
| AGEFLEX FM246 | 2.7 | 2.7 | 2.7 | 2.7 | 2.7 |
| SARTOMER SR604 | 3.6 | 3.6 | 3.6 | 3.6 | 3.6 |
| SARTOMER SR340 | 0.7 | 0.7 | 0.7 | 0.7 | 0.7 |
| BHT | 0.02 | 0.02 | 0.02 | 0.02 | 0.02 |
| Irgacure 127 | 1.5 | 1.5 | 1.5 | 1.5 | 1.5 |
| Geniosil XL33 | — | 1.3 | — | — | — |
| Geniosil GF31 | — | — | 1.3 | — | — |
| Ebecryl 350 | — | — | — | 1.3 | — |
| Ebecryl 1360 | — | — | — | — | 1.3 |

Laser Engraving Properties

The compositions of Table 3 were coated at a thickness of 700 μm on a polyester support. The coated layers were covered with a Polyester/Silicone protective layer of 23 μm. UV-A curing was performed with a UV-A light box, as described in Example 1, for 2 minutes. After UV-A curing the protective layer was removed. UV-C post curing was performed with a light box, as described in Example 1. Post curing was performed under water for 20 minutes. To improve the flatness, the coated samples were fixed on a 1 mm thick polypropylene sheet with double sided tape.

Laser engraving was performed with the Synrad $CO_2$ laser described in example 1. The laser engraved holes were inspected with an optical microscope (Nikon), the microscope being connected with a digital camera (JVC, TK1270). The debris level, as observed with the optical microscope, has been given a rating number from 0 to 6; 0 meaning no liquid debris observed, 6 meaning a high liquid debris level. In table 4, the debris level (D.L., a scale from 0 to 6) and the diameter (Ø) of the laser engraved holes, obtained with the different cured compositions of Table 3 (INV-03 to INV-06 and COMP-13) are shown for different power settings of the $CO_2$ laser (85 and 100% of the maximum power) and different pixel dwell times (from 30 to 50 μs). The denotation 85:30 in Table 4 means a power setting of 85% of the maximum power and a pixel dwell time of 30 μs.

TABLE 4

| Laser setting | COMP-13 ø | COMP-13 D.L. | INV-03 ø | INV-03 D.L. | INV-04 ø | INV-04 D.L. | INV-05 ø | INV-05 D.L. | INV-06 ø | INV-06 D.L. |
|---|---|---|---|---|---|---|---|---|---|---|
| 85:30 | 66 | 5 | 92 | 1 | 86 | 2 | 108 | 0 | 107 | 0 |
| 85:40 | 85 | 4 | 103 | 1 | 115 | 2 | 134 | 0 | 131 | 0 |
| 85:50 | 124 | 5 | 113 | 1 | 123 | 2 | 139 | 0 | 148 | 0 |
| 100:30 | 112 | 5 | 111 | 1 | 112 | 2 | 119 | 0 | 113 | 0 |
| 100:40 | 118 | 4 | 119 | 1 | 126 | 2 | 142 | 0 | 140 | 0 |
| 100:50 | 139 | 5 | 152 | 1 | 156 | 2 | 150 | 0 | 154 | 0 |

Figure 5:
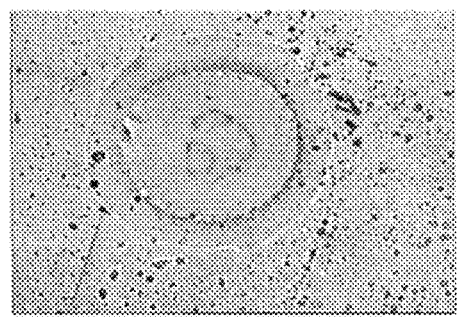
FIG. 5 shows optical microscope photographs of laser engraved holes of flexographic printing forms prepared with the curable compositions COMP-13, INV-03 to INV-06 of EXAMPLE 2.
Figure 5:
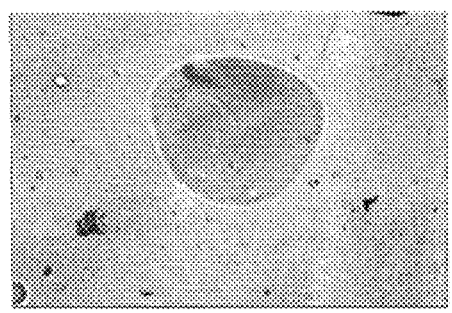
Figure 5:
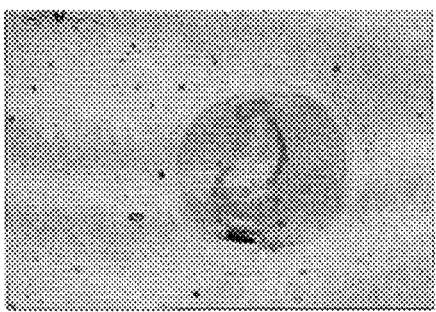
Figure 5:
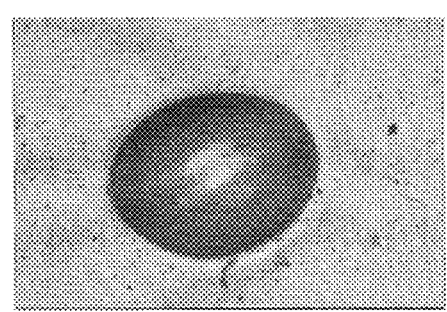
Figure 5:
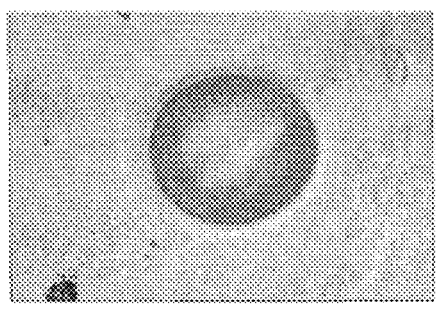

In FIG. 5 the microscopic photographs of the laser engraved holes (laser setting 100:40) of the samples COMP-13 and INV-03 to INV-06 are shown as illustration.

Adhesion, Flexibility and Tackiness

The formulations of Table 3 were coated at a thickness of 290 μm on a polyester support. The coated layers were covered with a Polyester/Silicone protective layer of 23 μm before curing.

UV-A curing was performed as described in Example 1 for 1 minute, followed by the removal of the protective layer.

UV-C post curing was performed as described in Example 1 for 20 minutes.

Adhesion

Adhesion was evaluated by two different test methods:

Cross Cut test method according to ASTM D 3359 using a tape from Permacel. A rating is given as a function of the percent area removed:

| area removed = 0% | rating = 0 |
| area removed = less than 5% | rating = 1 |
| area removed between 5-15% | rating = 2 |
| area removed between 15-35% | rating = 3 |
| area removed between 35-65% | rating = 4 |
| area removed more than 65% | rating = 5 |

Manual peel test. With a sharp knife an incision is made through the cured coating. At the incision, the detachability of the cured coating from the polyester support was evaluated:

| unable to detach | rating = 0 |
| very hard to detach | rating = 1 |
| hard to detach | rating = 2 |
| detachable | rating = 3 |
| easy to detach | rating = 4 |
| very easy to detach | rating = 5 |

Flexibility

The flexibility was evaluated as described in Example 1.

Tackiness

The tackiness of the surfaces of the cured layers was rated from 0 to 10:

| not tacky at all | rating = 0 |
| extremely tacky | rating = 10 |

The tackiness and the adhesion properties obtained with the cured formulations of Table 3 (INV-03 to INV-06 and COMP-13) are shown in Table 5 together with the Shore A Hardness, determined as described in Example 1. The flexibility of all samples was excellent.

TABLE 5

|  | Shore A Hardness | Cross Cut Test | Manual Peel Test | Tackiness |
|---|---|---|---|---|
| COMP-13 | 47 | 1 | 3 | 2 |
| INV-03 | 57 | 0 | 2 | 2 |
| INV-04 | 54 | 0 | 2 | 2 |
| INV-05 | 51 | 1 | 2 | 0 |
| INV-06 | 53 | 1 | 2 | 0 |

Printing Properties

The formulations of Table 3 were coated at a thickness of 290 μm on a pre-cured and processed DuPont Cyrel HIQ flexographic plate. UV-A curing was carried out as described in Example 1 for 2 minutes, followed by the removal of the protective cover film. UV-C post curing was performed under water as described in example 1 for 20 minutes.

Printing was carried out on the RK Koater laboratory flexographic printing press described in Example 1. The applied printing inks were Hydrokett 2000 Blue, a water based pigment ink for self adhesive labels form AKZO NOBEL and Aqua Base Plus Blue ET-51405, a water based pigment ink for self adhesive labels from Royal Dutch Printing Ink Factories Van Son. Printing was performed on Raflagloss paper (see Example 1). The print densities on paper, measured with a MacBeth RD918-SB densitometer, are shown in Table 6 for both inks. As a reference, the printing densities obtained with a DuPont Cyrel HIQ flexographic printing form are also shown in Table 6.

TABLE 6

|  | Print Densities | |
|---|---|---|
|  | Hydrokett 2000 blue | Aquabase plus ET51405 |
| COMP-13 | 2.07 | 1.97 |
| INV-03 | 2.06 | 1.96 |
| INV-04 | 2.06 | 1.95 |
| INV-05 | 2.07 | 1.94 |
| INV-06 | 2.09 | 1.94 |
| Dupont Cyrel HIQ | 2.07 | 1.95 |

Example 2 illustrates that flexographic printing form precursors prepared from curable composition containing an organic-silicon compound including at least one polymerizable are characterized by improved laser engraving properties, i.e., less debris formation, while the other properties such as flexibility, hardness, printing properties, adhesion are not adversely effected. Moreover, Example 2 illustrates that the laser engraving properties further improve when the number of polymerizable groups of the organo-silicon compounds increases.

Example 3

This example illustrates the influence of the amount of the organo-silicon compound used in the curable compositions to prepare the flexographic printing form precursor.

Preparation of the Curable Compositions

The curable compositions INV-07 to INV-09 and COMP-14 were prepared by mixing the ingredients from Table 7 at room temperature.

TABLE 7

| Ingredients (g) | COMP-14 | INV-07 | INV-08 | INV-09 |
|---|---|---|---|---|
| Varbatim HR50 | 60.0 | 60.0 | 60.0 | 60.0 |
| Ebecryl 1360 | — | 1.2 | 3.0 | 6.0 |
| Irgacure 127 | 3.0 | 3.0 | 3.0 | 3.0 |

Laser Engraving

The formulation COMP-14 and INV-07 to INV-09 were coated at a thickness of 700 μm on a polyester support. UV-A curing was performed, as described in example 2, for 2 minutes, followed by an UV-C curing, as described in example 2, under water for 20 minutes.

Laser engraving was performed as described in example 2.

The laser engraved holes were inspected with an optical microscope (Nikon), the microscope being connected with a digital camera (JVC, TK1270). The debris level, as observed with the optical microscope, has been given a rating number from 0 to 6 (0 meaning no liquid debris observed, 6 meaning a high liquid debris level) and is given in Table 8.

TABLE 8

| | Debris Level |
|---|---|
| COMP-14 | 6 |
| INV-07 | 2 |
| INV-08 | 1 |
| INV-09 | 0 |

From Table 8 it is clear that all inventive printing form precursors (INV-07 to INV-09) obtained with the curable compositions including the organo-silicon compound are characterized by less debris formation upon laser engraving compared to the comparative printing form precursor obtained with a curable composition without the organo-silicon compound. From Table 8 can be concluded that the debris formation further decreases when the amount of organo-silicon compound increases from 1.8 to 8.6% by weight relative to the total weight of the curable compositions.

Example 4

This example illustrates the preferred embodiment wherein the outermost layer is formed by a curable composition consisting essentially of the organo-silicon compound and an initiator.

On top of the comparative example COMP-14 of example 3, a curable composition including 30.0 g of Ebecryl 1360 and 1.5 g of Irgacure 651 was coated at a thickness of 30 μm, followed by UV-A and UV-C curing as described in Example 3, resulting in the inventive example INV-10.

Figure 6:
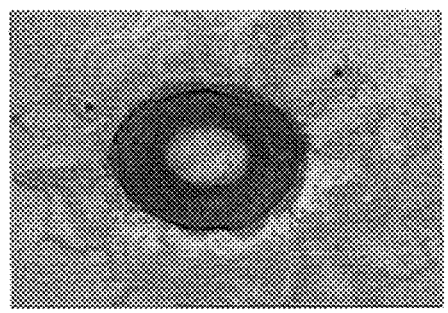
FIG. 6 shows optical microscope photographs of laser engraved holes of the flexographic printing forms COMP-14 and of EXAMPLE 4.
Figure 6:
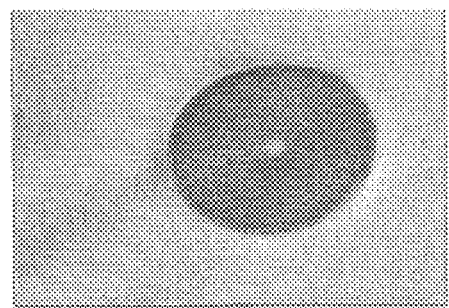

Laser engraving was performed and evaluated as described in example 2. The debris levels of INV-10 and COMP-14 are shown in Table 9. The optical microscope photographs of the engraved holes are shown in FIG. 6 as an illustration. From Table 9 and FIG. 6 it is clear that providing a top-layer consisting essentially of the organo-silicon and an initiator results in less debris formation upon laser engraving. This example illustrates the surprising result that a flexographic printing form precursor including a top-layer consisting essentially of the organo-silicon compound and an initiator and with a thickness (much) smaller than the laser engraving depth, results in a substantial improvement of the debris formation upon laser engraving of the precursor.

TABLE 9

| | Debris Level |
|---|---|
| COMP-14 | 6 |
| INV-10 | 0 |

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method for making a flexographic printing forme comprising the steps of:
   providing a flexographic printing forme precursor, the precursor being prepared by:
   (i) providing at least one layer of a curable composition on a substrate; and
   (ii) curing the at least one layer; and
   imagewise exposing the precursor with a laser to engrave a relief image in the precursor; wherein
   the curable composition defining an outermost layer of the flexographic printing forme includes at least 0.5% and less than 20% by weight, relative to the total weight of the curable composition, of an organo-silicon compound including at least one polymerizable group; and
   the organo-silicon compound includes at least four polymerizable groups.

2. The method according to claim 1, wherein the organo-silicon compound includes at least six polymerizable groups.

3. The method according to claim 1, wherein an amount of the organo-silicon compound is at least 2.5% by weight relative to the total weight of the curable composition.

4. The method according to claim 1, wherein the curable composition defining the outermost layer of the flexographic printing forme further includes a photo-initiator.

5. The method according to claim 1, wherein if more than one layer of the curable composition is provided on the substrate, the curing step is performed after each layer of the curable composition is provided.

6. The method according to claim 1, wherein the step of curing the at least one layer is performed with ultraviolet radiation.

7. The method according to claim 5, wherein the step of curing is performed with ultraviolet radiation.

8. The method according to claim 6, wherein the step of curing the at least one layer includes first and second steps of curing with UV-A or UV-C radiation.

9. The method according to claim 7, wherein the step of curing the at least one layer includes first and second steps of curing with UV-A or UV-C radiation.

10. A method for making a flexographic printing forme comprising the steps of:
    providing a flexographic printing forme precursor, the precursor being prepared by:

(i) providing at least one layer of a curable composition on a substrate; and
(ii) curing the at least one layer; and
imagewise exposing the precursor with a laser to engrave a relief image in the precursor; wherein
the curable composition defining an outermost layer of the flexographic printing forme includes at least 0.5% by weight, relative to the total weight of the curable composition, of an organo-silicon compound including at least one polymerizable group;
the curable composition defining the outermost layer of the flexographic printing forme consists essentially of the organo-silicon compound, or consists essentially of the organo-silicon compound and a photo-initiator; and
the curable composition defining the outermost layer of the flexographic printing forme which consists essentially of the organo-silicon compound is cured with electron beam irradiation.

11. The method according to claim 10, wherein the organo-silicon compound includes at least six polymerizable groups.

12. The method according to claim 11, wherein at least one of the layers of curable composition includes at least 50% by weight, relative to the total weight of the composition, of a urethane (meth)acrylate oligomer.

13. A method for making a flexographic printing forme comprising the steps of:
providing a flexographic printing forme precursor, the precursor being prepared by:
(i) providing at least one layer of a curable composition on a substrate; and
(ii) curing the at least one layer; and
imagewise exposing the precursor with a laser to engrave a relief image in the precursor; wherein
the curable composition defining an outermost layer of the flexographic printing forme includes at least 0.5% by weight, relative to the total weight of the curable composition, of an organo-silicon compound including at least one polymerizable group; and
the curable composition defining the outermost layer of the flexographic printing forme further includes at least 50% by weight, relative to the total weight of the composition, of a urethane (meth)acrylate oligomer.

* * * * *